United States Patent
Li et al.

(10) Patent No.: US 9,774,308 B2
(45) Date of Patent: Sep. 26, 2017

(54) AUTOMATIC GAIN CONTROL IN A HETEROGENEOUS MOBILE COMMUNICATION NETWORK

(71) Applicant: Telefonaktiebolaget L M Ericsson (publ), Stockholm (SE)

(72) Inventors: Shaohua Li, Beijing (CN); Rainer Bachl, Nürnberg (DE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 11 days.

(21) Appl. No.: 14/650,330

(22) PCT Filed: Dec. 14, 2012

(86) PCT No.: PCT/CN2012/086636
§ 371 (c)(1),
(2) Date: Jun. 8, 2015

(87) PCT Pub. No.: WO2014/089819
PCT Pub. Date: Jun. 19, 2014

(65) Prior Publication Data
US 2015/0311877 A1    Oct. 29, 2015

(51) Int. Cl.
*H04W 52/24* (2009.01)
*H03G 3/20* (2006.01)
(Continued)

(52) U.S. Cl.
CPC ............ *H03G 3/20* (2013.01); *H03G 3/3078* (2013.01); *H04B 17/318* (2015.01); *H04W 52/244* (2013.01); *H04W 84/045* (2013.01)

(58) Field of Classification Search
CPC ...... H03G 3/20; H03G 3/3078; H04B 17/318; H04W 52/244; H04W 84/045
See application file for complete search history.

(56) References Cited

U.S. PATENT DOCUMENTS 9,234,957 B2 * 1/2016 Stern-Berkowitz ..... H04W 4/22
9,426,703 B2 * 8/2016 Geirhofer ............. H04L 5/0032

FOREIGN PATENT DOCUMENTS

GB         2492794 B  *  1/2013  ............... H03G 3/30
JP   GB 2492794 B  *  7/2013  ........... H03G 3/3078
(Continued)

OTHER PUBLICATIONS

3rd Generation Partnership Project, "3rd Generation Partnership Project; Technical Specification Group Radio Access Network; Evolved Universal Terrestrial Radio Access (E-UTRA) and Evolved Universal Terrestrial Radio Access Network (E-UTRAN); Overall description; Stage 2 (Release 10)", Technical Specification, 3GPP TS 36.300 V10.0.0, Jun. 1, 2010, pp. 1-183, 3GPP, France.
(Continued)

*Primary Examiner* — Phirin Sam
*Assistant Examiner* — Debebe Asefa
(74) *Attorney, Agent, or Firm* — Coats & Bennett, PLLC

(57) ABSTRACT

The invention refers to performing an automatic gain control—AGC—with respect to a received signal comprising a plurality of consecutive subframes (S1 S12), comprising identifying subframes that are associated to a first subset of the consecutive subframes (S1, S3, S4, S5, S7. S8, S9, S11, S12), performing a first (10) signal power measurement with respect to the received signal during the first subset of the consecutive subframes, and performing the AGC according to the first signal power measurement. The invention further refers to a user equipment and to a corresponding computer program.

30 Claims, 10 Drawing Sheets

(51) Int. Cl.
     *H03G 3/30*     (2006.01)
     *H04B 17/318*   (2015.01)
     *H04W 84/04*    (2009.01)

(56) References Cited

FOREIGN PATENT DOCUMENTS

| WO | 2009095369 A1 | 8/2009 |
|----|---------------|--------|
| WO | 2009138361 A1 | 11/2009 |
| WO | 2009149565 A1 | 12/2009 |

OTHER PUBLICATIONS

3rd Generation Partnership Project, "3rd Generation Partnership Project; Technical Specification Group Radio Access Network; Evolved Universal Terrestrial Radio Access (E-UTRA) and Evolved Universal Terrestrial Radio Access Network (E-UTRAN); Overall description; Stage 2 (Release 11)", Technical Specification, 3GPP TS 36.300 V11.0.0, Dec. 1, 2011, pp. 1-194, 3GPP, France.

3rd Generation Partnership Project, "3rd Generation Partnership Project; Technical Specification Group Radio Access Network; Evolved Universal Terrestrial Radio Access (E-UTRA); Physical Channels and Modulation (Release 11)", Technical Specification, 3GPP TS 36.211 V11.0.0, Sep. 1, 2012, pp. 1-106, 3GPP, France.

Ericsson et al., "System simulation results and methodology for defining interference levels in eICIC performance tests", 3GPP TSG-RAN WG4 Meeting #61, San Francisco, USA, Nov. 14, 2011, pp. 1-6, R4-116203, 3GPP.

Huawei, et al., "Suggested parameters for FeICIC demodulation testing under 9dB bias", 3GPP TSG-RAN WG4 Meeting #63, Prague, Czech Republic, May 21, 2012, pp. 1-11, R4-122478, 3GPP.

\* cited by examiner

| $r$ | Unit | $r/P^s_{pico,CRS}$ (normalized power relative to $P^s_{pico,CRS}$) | |
| --- | --- | --- | --- |
| | | ABS subframe | Non-ABS subframe |
| $P^s_{pico,CRS}$ | dB | 0 | 0 |
| $P^I_{doninated\ macros,CRS}$ | dB | 9 | 9 |
| $P^I_{doninated\ macros,data}$ | dB | N/A | 9 |
| $P^I_{others}$ | dB | -1 | 2.2 |

Fig. 9

| Necessary reduction of the gain setting with respect to measurement power to avoid additional clipping errors ||||
|---|---|---|---|
| Measurement used for AGC adjustment | Max. possible ratio in measured power from one subframe to the next subframe, except for fading | Max. possible ratio of total received power and max. measured power | reduction [dB] |
| RSSI | $(P^I_{dominant\ macro,CRS} + 2P^I_{dominant\ macro,data} + P^s_{pico,CRS} + 2P^s_{pico,data} + 3P^I_{others}$ (non-ABS) ) / $(P^I_{dominant\ macro,CRS} + P^s_{pico,CRS} + 3P^I_{others}$ (ABS) ) | 1.0 | 4.48 dB |
| RSRERP (non-colliding CRS case) | $(P^I_{dominant\ macro,data} + P^s_{pico,CRS} + P^I_{others}$ (non-ABS) ) / $(P^s_{pico,CRS} + P^I_{others}$ (ABS) ) | $(P^I_{dominant\ macro,CRS} + 2P^I_{dominant\ macro,data} + P^s_{pico,CRS} + 2P^s_{pico,data} + 3P^I_{others}$ (non-ABS) ) / $(P^I_{dominant\ macro,data} + P^s_{pico,CRS} + P^I_{others}$ (non-ABS) ) | 12.48 dB |
| RSRERP (colliding CRS case) | $(P^I_{dominant\ macro,CRS} + P^s_{pico,CRS} + P^I_{others}$ (non-ABS) ) / $(P^I_{dominant\ macro,CRS} + P^s_{pico,CRS} + P^I_{others}$ (ABS) ) | $(P^I_{dominant\ macro,CRS} + 2P^I_{dominant\ macro,data} + P^s_{pico,CRS} + 2P^s_{pico,data} + 3P^I_{others}$ (non-ABS) ) / $(P^I_{dominant\ macro,CRS} + P^s_{pico,CRS} + P^I_{others}$ (non-ABS) ) | 5.14 dB |
| RSRP (serving cell) | 1.0 | $(P^I_{dominant\ macro,CRS} + 2P^I_{dominant\ macro,data} + P^s_{pico,CRS} + 2P^s_{pico,data} + 3P^I_{others}$ (non-ABS) ) / $P^s_{pico,CRS}$ | 15.03 dB |

Fig. 10

| Necessary reduction of AGC gain setting with respect to measurement power to avoid additional clipping errors in ABS subframes only ||||
|---|---|---|---|
| Measurement used for AGC adjustment | Max. possible ratio in measured power from one subframe to the next subframe, except for fading | Max. possible ratio of total received power and max. measured power | reduction [dB] |
| RSSI | $(P^I_{dominant\ macro,CRS} + P^s_{pico,CRS} + 2P^s_{pico,data} + 3P^I_{others}(ABS))/(P^I_{dominant\ macro,CRS} + P^s_{pico,CRS} + 3P^I_{others}(ABS))$ | 1.0 | 0.71 dB |
| RSRERP (non-colliding CRS case) | 1.0 | $(P^I_{dominant\ macro,CRS} + P^s_{pico,CRS} + 2P^s_{pico,data} + 3P^I_{others}(ABS))/(P^s_{pico,CRS} + P^I_{others}(ABS))$ | 8.71 dB |
| RSRERP (colliding CRS case) | 1.0 | $(P^I_{dominant\ macro,CRS} + P^s_{pico,CRS} + 2P^s_{pico,data} + 3P^I_{others}(ABS))/(P^I_{dominant\ macro,CRS} + P^s_{pico,CRS} + P^I_{others}(ABS))$ | 1.36 dB |
| RSRP (serving cell) | 1.0 | $(P^I_{dominant\ macro,CRS} + P^s_{pico,CRS} + 2P^s_{pico,data} + 3P^I_{others}(ABS))/P^s_{pico,CRS}$ | 11.25 dB |

Fig. 11

| Necessary reduction of AGC gain setting with respect to measurement power to avoid additional clipping errors in non-ABS subframes only ||||
|---|---|---|---|
| Measurement used for AGC adjustment | Max. possible ratio in measured power from one subframe to the next subframe, except for fading | Max. possible ratio of total received power and max. measured power | reduction [dB] |
| RSSI | $(P^I_{dominant\ macro,CRS} + 2P^I_{dominant\ macro,data}$ + $P^s_{pico,CRS} + 2P^s_{pico,data}$ + $3P^I_{others}$ (non-ABS) ) / $(P^I_{dominant\ macro,CRS} + P^s_{pico,CRS}$ + $3P^I_{others}$ (non-ABS) ) | 1.0 | 3.59 dB |
| RSRERP (non-colliding CRS case) | $(P^I_{dominant\ macro,data} + P^s_{pico,CRS}$ + $P^I_{others}$ (non-ABS) ) / $(P^s_{pico,CRS} + P^I_{others}$ (non-ABS) ) | $(P^I_{dominant\ macro,CRS} + 2P^I_{dominant\ macro,data}$ + $P^s_{pico,CRS} + 2P^s_{pico,data}$ + $3P^I_{others}$ (non-ABS) ) / $(P^I_{dominant\ macro,data} + P^s_{pico,CRS}$ + $P^I_{others}$ (non-ABS) ) | 10.78 dB |
| RSRERP (colliding CRS case) | 1.0 | $(P^I_{dominant\ macro,CRS} + 2P^I_{dominant\ macro,data}$ + $P^s_{pico,CRS} + 2P^s_{pico,data}$ + $3P^I_{others}$ (non-ABS) ) / $(P^I_{dominant\ macro,CRS} + P^s_{pico,CRS}$ + $P^I_{others}$ (non-ABS) ) | 4.77 dB |
| RSRP (serving cell) | 1.0 | $(P^I_{dominant\ macro,CRS} + 2P^I_{dominant\ macro,data}$ + $P^s_{pico,CRS} + 2P^s_{pico,data}$ + $3P^I_{others}$ (non-ABS) ) / $P^s_{pico,CRS}$ | 15.03 dB |

Fig. 12

| Necessary reduction of AGC gain setting with respect to measurement power to avoid additional clipping errors in ABS subframes only ||||
|---|---|---|---|
| Measurement used for AGC adjustment | Max. possible ratio in measured power from one subframe to the next subframe, except for fading | Max. possible ratio of total received power and max. measured power | reduction [dB] |
| Sum RSRERP (non-colliding CRS case) (serving cell and interfering cell) | $(P^I_{dominant\ macro,CRS} + P^s_{pico,CRS} + 2P^s_{pico,data} + 2P^I_{others}(ABS))/(P^I_{dominant\ macro,CRS} + P^s_{pico,CRS} + 2P^I_{others}(ABS))$ | $(P^I_{dominant\ macro,CRS} + P^s_{pico,CRS} + 2P^s_{pico,data} + 3P^I_{others}(ABS))/(P^I_{dominant\ macro,CRS} + P^s_{pico,CRS} + 2P^s_{pico,data} + 2P^I_{others}(ABS))$ | 1.02 dB |
| Sum RSRERP (colliding CRS case) (serving cell and interfering cell) | 1.0 | $(P^I_{dominant\ macro,CRS} + P^s_{pico,CRS} + 2P^s_{pico,data} + 3P^I_{others}(ABS))/(P^I_{dominant\ macro,CRS} + P^s_{pico,CRS} + P^I_{others}(ABS))$ | 1.36 dB |
| Sum RSRP (serving cell and interfering cell) | 1.0 | $(P^I_{dominant\ macro,CRS} + P^s_{pico,CRS} + 2P^s_{pico,data} + 3P^I_{others}(ABS))/(P^s_{pico,CRS} + P^I_{dominant\ macro,CRS})$ | 1.73 dB |

Fig. 13

| Necessary reduction of AGC gain setting with respect to measurement power to avoid additional clipping errors in non-ABS subframes only | | | |
|---|---|---|---|
| Measurement used for AGC adjustment | max possible ratio (measured power from one subframe to the next subframe, except for fading) | max possible ratio of total received power and max. measured power | reduction [dB] |
| Sum RSRERP (non-colliding CRS case) (serving cell and interfering cell) | $(2P^I_{dominant\ macro,data} + 2P^s_{pico,CRS} + 2P^I_{others}$ (non-ABS) $)$ / $((P^s_{pico,CRS} + 2P^I_{others}$ (non-ABS) $+ P^I_{dominant\ macro,crs}))$ | $(P^I_{dominant\ macro,CRS} + 2P^I_{dominant\ macro,data} + P^s_{pico,CRS} + 2P^s_{pico,data} + 3P^I_{others}$ (non-ABS) $)$ / $(2P^I_{dominant\ macro,data} + 2P^s_{pico,CRS} + 2P^I_{others}$ (non-ABS) $)$ | 4.13 dB |
| Sum RSRERP (colliding CRS case) (serving cell and interfering cell) | 1.0 | $(P^I_{dominant\ macro,CRS} + 2P^I_{dominant\ macro,data} + P^s_{pico,CRS} + 2P^s_{pico,data} + 3P^I_{others}$ (non-ABS) $)$ / $(P^I_{dominant\ macro,CRS} + P^s_{pico,CRS} + P^I_{others}$ (non-ABS) $)$ | 4.77 dB |
| Sum RSRP (serving cell and interfering cell) | 1.0 | $(P^I_{dominant\ macro,CRS} + 2P^I_{dominant\ macro,data} + P^s_{pico,CRS} + 2P^s_{pico,data} + 3P^I_{others}$ (non-ABS) $)$ / $(P^s_{pico,CRS} + P^I_{dominant\ macro,CRS})$ | 5.51 dB |

AUTOMATIC GAIN CONTROL IN A HETEROGENEOUS MOBILE COMMUNICATION NETWORK

TECHNICAL FIELD

The present invention relates to Automatic Gain Control -AGC, and specifically to UE AGC adjustment control in heterogeneous mobile communication networks with inter-cell interference.

BACKGROUND

Heterogeneous deployments can be described as a deployment of a radio access network, wherein low power nodes are placed throughout a macro-cell layout. The low-power nodes might be so-called pico cells or so-called Closed Subscribe Group (CSG) cells. Such a placement of pico (or CSG) cells might e.g. provide enhanced capacity locally or improved indoor coverage.

Within a deployment of the pico cells, certain subframes are provided, in which a macro cell significantly or almost entirely reduces transmission energy; such subframes are often referred to as Almost-Blank Subframes (ABS). A deployment of macro- and pico cells requires time synchronization (time alignment) and a proper planning of an ABS scheme.

In above described heterogeneous networks, in certain areas, the UE shall be able to connect or stay connected to the pico cell although the macro sell signals, e.g. a so-called cell-specific reference signal -CRS- from the macro cell is received with higher power compared to a corresponding pico cell CRS Such deployment is also being referred to as cell range extension (CRE) being specified in recent 3GPP LTE or Evolved Universal Terrestrial Radio Access (E-UTRA) specification documents. Thereto, documents 3GPP TS 36.300 version 10.0.0 (as member of 3GPP LTE Release 10 documents, also being referred to as LTE Rel-10 in the following) and 3GPP TS 36.300 version 11.0.0 (as member of 3GPP LTE Release 11 documents also being referred to as LTE Rel-11 in the following) each specify (e.g. in section 16.1.5) an inter-cell coordination function located in the eNodeB -eNB- to manage radio resources for keeping inter-cell interference under control.

The macro cell CRS thus may be received with higher power as compared to the pico cell CRS, e.g. about 0-6 dB according to a so-called enhanced intercell interference coordination -eICIC- according to LTE Rel-10, and 6-12 dB according to a so-called further enhanced intercell interference coordination -feICIC- according to LTE Rel-11.

FIG. 1 shows a sketch of an exemplary simple heterogeneous network comprising a macro base station or macro eNB 11, a macro cell (area) 12 served by the macro eNB, a pico base station or pico eNB 21, a pico cell (area) served by the pico eNB 21, wherein the pico cell area is divided into a kernel pico cell area 22a and an extended pico area 22b, in the following also being referred to as cell range extension -CRE- area. Further, a first exemplary user equipment UE1 actually located in the kernel pico cell area 22a and a second user equipment UE2 actually located in the CRE area 22b is depicted.

To secure reliable transmission of the control channel and efficient transmission of the Physical downlink shared channel -PDSCH- of the second user equipment UE2 located in the CRE of the pico cell 22b, ABS subframes in the macro cell 21 are configured to transmit only limited (or necessary) data, e.g. only signal such as Physical Broadcast Channel -PBCH- signals, Primary/Secondary Synchronization Signals -PSS/SSS- and CRS according to in Rel-10. Hence, in ABS subframes, the second user equipment UE2 experiences low interference from the macro cell for the data channel, and conversely high interference from macro cells in non-ABS subframes. On the other hand, first user equipments located sufficiently close to the center of the pico cell, also being referred to as non-CRE UEs, e.g. the first user equipment UE1 according to FIG. 1, the interference from the macro cell may be relatively small as compared with the signal from the pico cell.

One of the properties of above-discussed releases is that it allows the eNB to restrict the channel measurements by UEs attached to them to a specific set of ABS subframes. The UEs are provided with different CSI-measurement subsets corresponding to the subframes that the UE is allowed to use. CRE users, i.e. user equipments located in the CRE, are only allowed to report CSI measurements for the ABS as they are only allowed to transmit during these subframes. Non-CRE users may transmit 2 different subsets of the CSI measurements, one for the ABS and another for the non-ABS as they are may be allowed to transmit through all the subframes.

FIG. 2 shows an exemplary pattern of ABS subframes within a plurality of subsequent subframes S1-S12. By way of example every fourth subframe, e.g. subframes S2, S6 and S10 of the consecutive subframes S1-S12 are ABS frames.

The channel state information (CSI corresponding to CQI/PMI/RI) is different for ABS and non-ABS subframes. Averaging the CSI over both ABS and non-ABS subframes is not meaningful and, hence, e.g. according to Rel-10, two subframe sets, CSI_0 and CSI_1, are signaled to the UE for measurement, as illustrated in FIG. 2. The UE currently located within the CRE area, e.g. UE1 according to FIG. 1 may then perform an independent measurement and a corresponding feedback for each CSI subframe set CSI_0 and CSI_1.

UEs perform an automatic gain control -AGC- to normalize the input signal such that the limited dynamic range of the subsequent processing subsystems causes minimal degradation of the signal quality. Typically an AGC is set to provide some average magnitude value that is below the maximum value of a corresponding analog-to digital circuit ADC to avoid a signal clipping. An optimal gain of AGC may be derived e.g. from a measured variance of the reference signal or from the measured mean of the absolute value of the reference signal. These measurements are usually identical for both quadrature components of the equivalent complex baseband signal and can be averaged over both quadrature components. The gain is usually adjusted to maximize a average signal-to-quantization noise ratio (SNR), whereby quantization noise corresponds to noise from clipping or saturation, $N_{Clip}$, as well as noise due to the limited resolution of the quantized signal, $N_{quant}$.

For maximizing the signal-to-quantization noise ratio, there are two conflicting requirements. On the one hand, the signals should be kept large with respect to the quantizing interval to achieve a good resolution. On the other hand, the signal should be kept small enough to avoid (excessive) saturation or clipping in the quantizer. The opposing requirements may be resolved by scaling the input signal so that its root mean squared (RMS) value is a specified fraction of the full-scale quantizer range. The specified fraction is chosen to balance the saturation errors (weighted by their probability of occurrences), also called clipping errors, against the quantizing errors (which are similarly weighted) and thus achieve a maximum SNR. The relationship among SNR, quantizing error and clipping error is shown in FIG. 3 for Gaussian distributed signals, where $SNR=(S+I)/(N_{clip}+N_{quant})$. Here, $N_{Clip}$ is the variance of clipping error, $N_{quant}$ is the variance of quantizing error, S is the desired signal power, and I represents interference and thermal noise power received in the front-end. FIG. 3 by way of example shows the SNR as a function of the ratio of ADC adjustment in dB relative to full scale (dBFS) of the ADC when 10 bits are used for quantizing and the input signal is Gaussian distributed.

FIG. 3 shows a diagram of an exemplary ADC dynamic range versus noise without DC offset. The achievable dynamic range or (S+I)/(Nclip+Nquant) is a function of the target value in dBFS, whereby exemplarily the input signal is Gaussian distributed and quantized with 10 bits (with no DC offset). It can be seen that reduced signal levels correspond to smaller AGC adjustment on the abscissa, and represent a shift to the left. Similarly, increased input signal levels also correspond to larger AGC adjustment on the abscissa, and represent shift to the right. According to the example of FIG. 3, a maximum of SNR=51.56 dB can be achieved when AGC adjustment is −13.04 dB of full scale in the case of Gaussian distributed signals quantized with 10 bits per quadrature component.

The gain for AGC is usually adjusted by comparing a certain measured power (e.g. a measured mean absolute amplitude) with a corresponding pre-configured target value for the power (or target value for the mean absolute amplitude) that depends on the chosen quantization of the signal flow as described in the previous Section. AGC adjustment may be based on following power measurements:

Reference signal resource element received power -RSRERP- measurements indicative of a received power of the serving cell reference signal (RS) resource elements (REs), Reference signal received power -RSRP- measurements indicative of the reference signal resource element received power, wherein some disturbing power, e.g. power with respect to interference (e.g. being removed by cancellation or filtering), thermal noise (hence RSRERP=RSRP+interference power+thermal noise power at the reference signal resource elements)

Received signal strength indicator -RSSI- measurements indicative of a linear average of the total received power observed only in OFDM symbols containing reference symbols (e.g. for one of a plurality of antenna ports, e.g. antenna port 0), in the measurement bandwidth, from all sources, including co-channel serving and non-serving cells, adjacent channel interference, thermal noise etc.

When enhanced intercell interference coordination -eICIC- is applied according to Rel-10 or further enhanced intercell interference coordination -feICIC- is applied according to Rel-11, the total received power may change significantly between ABS subframes and non-ABS subframes. Even in ABS subframes itself, the total received power observed in each OFDM symbols may also change significantly. The received power observed in each OFDM symbols in the measurement bandwidth.

Conventional automatic gain control -AGC- algorithms make no difference between ABS and non-ABS subframes. Even in case of ABS, the CRS may be still transmitted (to maintain backward compatibility). Thus interference due to CRS transmission may still be significant. It is one aim of the invention to improve the function of the AGC by taking into account the existence ABS subframes.

SUMMARY

It is an object of the present invention to improve an automatic gain control in a heterogeneous mobile communication network.

This object is achieved by the independent claims. Advantageous embodiments are described in the dependent claims.

According to embodiments an automatic gain control -AGC- within a user equipment in a mobile communication environment is performed with respect to a received signal comprising a plurality of consecutive subframes. The received signal may be derived from a radio signal received at one or a plurality of antennas of the user equipment. The following steps may be performed:

identifying subframes that are associated to a first subset of the consecutive subframes, performing a first signal power measurement with respect to the received signal during the first subset of the consecutive subframes, and performing the AGC according to the first signal power measurement.

In an embodiment, a second signal power measurement is performed with respect to the received signal during a second subset of the consecutive subframes comprising the subframes that are not comprised by the first subset, and the AGC is performed according to the first signal power measurement during the subframes of the first subset, and performing the AGC according to the second signal power measurement during the subframes of the second subset.

The received signal may comprise first signal contributions received from a first base station, e.g. a macro cell eNB, and a second signal contributions received from a second base station, e.g. a pico cell eNB. During the first subset of the consecutive frames both base stations transmit each the first and second signal contributions without power restrictions, wherein these subframes are also being referred to as non-ABS or non-ABS subframes. During the second subset of the consecutive frames the first base station transmits the first signal contributions at a reduced power wherein these subframes are also being referred to as ABS or ABS subframes.

Identifying the sets of subframes may be performed by identifying a repetitive pattern of subframes of the first subset and the second subset. The UE thereto may identify the sets of subframes based on the relationship of CSI measurement set, e.g., CSI_1 and CSI_0, and the RLM/RRM (Radio link monitor/radio resource management) restricted measurement patterns signaled by the eNB. It may also or alternatively be based on interference measurements in CSI_1 and CSI _0 to indentify the sets. Further, it may also be based on the presence of neighbor cell's PCFICH/PHICH (Physical control format indicator channel/Physical hybrid-ARQ indicator channel) channel, etc.

For a UE connected to the pico cell, reception in non-ABS subframes is required for CSI measurements and for obtaining good channel estimates from channel estimation filtering over all subframes. In order to perform an AGC specific for ABS subframes, a separate gain setting for non-ABS subframes may be performed. Since the UE does not receive data in non-ABS subframes, the gain setting for non-ABS subframes may be less critical as compared to the gain setting for ABS subframes.

Performing the AGC may comprise determining a first gain value for performing the AGC during said first subset of the consecutive subframes (non-ABS), and determining a second gain value for performing the AGC outside said first subset of subframes, e.g. the second subset of subframes (ABS).

The second gain value may be derived from the first gain value or vice versa. Alternatively, the AGC may be performed according to the first signal power measurement during the subframes of the first subset (non-ABS), and according to the second signal power measurement during the subframes of the second subset (ABS).

The second signal power measurement may comprise determining a serving cell power value by performing a power measurement of resource elements associated to a serving cell and determining an interfering cell power value by performing a power measurement of resource elements associated to one or a plurality of an interfering cells, and performing the corresponding AGC according to a combination of serving cell power value and the interfering cell power value during the subframes of the second subset. The combination of serving cell power value and the interfering cell power value may be based on one a sum of both power values or on a weighted sum of both power values.

Performing the signal power measurement may be based on power contributions of resource elements that carry a cell-specific reference signal -CRS- within the subframes. Such measurement may be a RSRERP or a RSRP measurement indicative of a linear average over the power contributions of the resource elements that carry cell-specific reference signals within a considered measurement frequency bandwidth.

Performing the first signal power measurement may comprise determining a power value based on power contributions of resource elements that carry a cell-specific reference signal -CRS- within the subframes further comprising detecting if a first CRS from the serving cell and a second CRS from a dominant interfering cell of the one or the plurality of interfering cells are colliding or not colliding, and performing the AGC in dependency on whether the first CRS and the second CRS are colliding or not colliding. Said detection may be performed by determining a physical cell ID, e.g. being acquired based on synchronization channel communication or based on high layer signaling.

The present invention also concerns computer programs comprising portions of software codes in order to implement the method as described above when operated by a respective processing unit e.g. of a mobile terminal. The computer program can be stored on a computer readable medium. The computer-readable medium can be a permanent or rewritable memory e.g. within the mobile terminal or located externally. The respective computer program can be also transferred e.g. to the mobile terminal for example via a cable or a wireless link as a sequence of signals.

In the following, detailed embodiments of the present invention shall be described in order to give the skilled person a full and complete understanding. However, these embodiments are illustrative and not intended to be limiting.

BRIEF DESCRIPTION OF THE FIGURES

FIG. 9 shows a first table with exemplary power contributions for ABS and non-ABS subframes, FIG. 10 shows a table indicative of a necessary reduction of an AGC gain setting to avoid additional clipping errors irrespective of a presence of ABS and non-ABS, FIG. 11, 12 each shows a table indicative of a necessary reduction of an exemplary AGC gain setting to avoid additional clipping errors in ABS subframes and in non-ABS subframes respectively, and FIG. 13, 14 each shows a table indicative of a necessary reduction of an AGC gain setting to avoid additional clipping errors in ABS subframes and in non-ABS subframes respectively, taking into account a power of one or a plurality of dominant interfering cells.

DETAILED DESCRIPTION

When e.g. using in an LTE network intercell interference coordination, e.g. a so-called enhanced intercell interference coordination -eICIC- according to Rel-10 or further enhanced intercell interference coordination -feICIC- according to Rel-11, the signal power received at a user equipment -UE- will vary significantly between ABS subframes and non-ABS subframes. If traditional AGC adjustment is used, the signal in non-ABS subframe may be saturated or clipped. Hence, the receiver performance might encounter significant performance degradation due to inappropriate AGC adjustment.

Thereto, according to following embodiments, for AGC adjustments, the UE distinguishes ABS subframes from non-ABS subframes.

In a further development distinguishing is based on detecting an ABS pattern from the received signal at the UE, so that no explicit signaling about the subframe configuration information is required at the UE.

Figure 1:
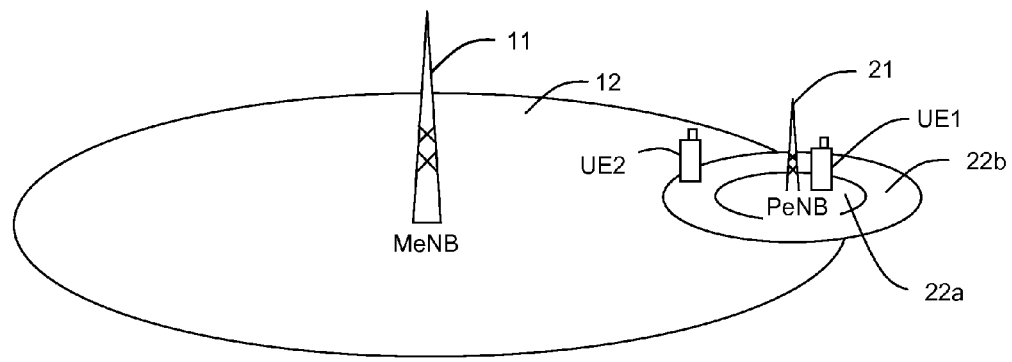
FIG. 1. shows a sketch of an exemplary simple heterogeneous network.
Figure 2:
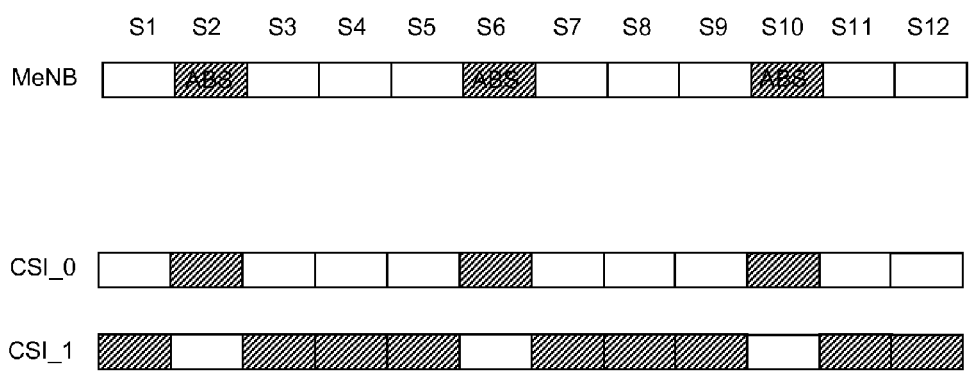
FIG. 2. shows an exemplary pattern of ABS subframes within a plurality of subsequent subframes S1-S12, FIG. 3. shows a diagram of an exemplary ADC dynamic range versus noise without DC offset.
Figure 3:
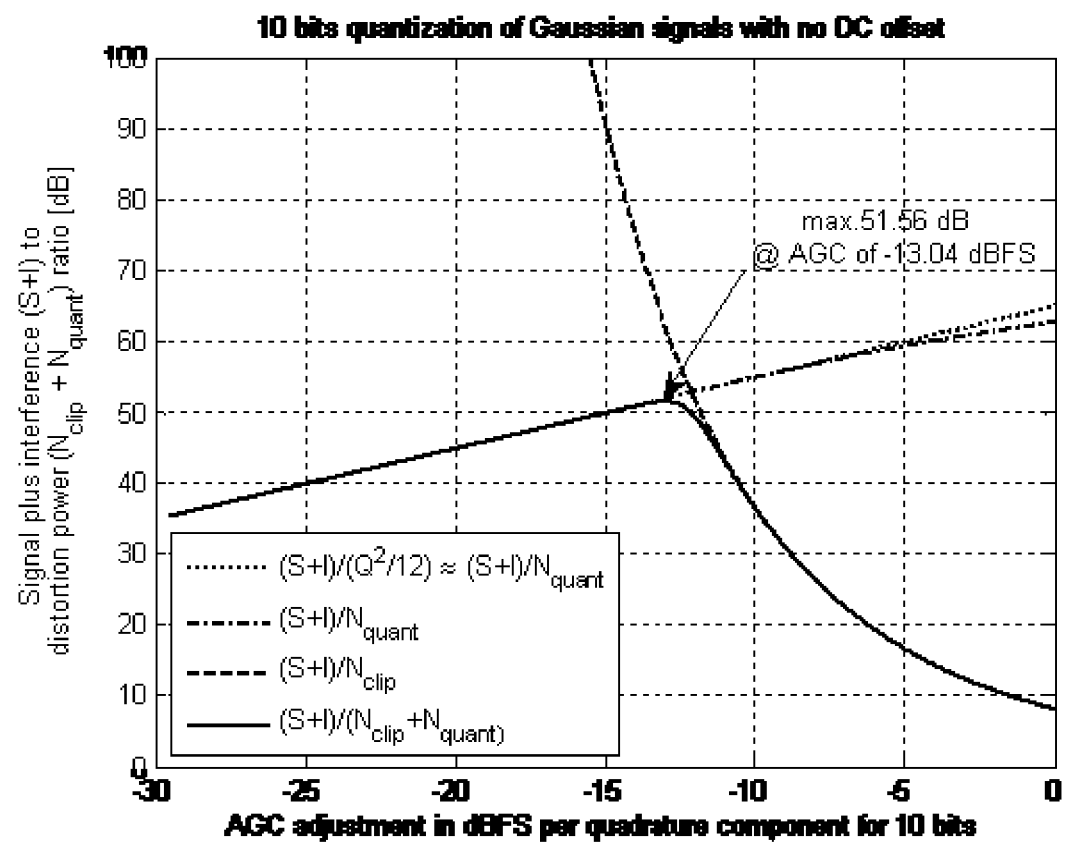

CSI subframe configuration pattern by way of example includes two sub frame sets, e.g. CSI_0 and CSI_1 as shown in FIG. 2. In a practice, one subframe set, e.g. CSI_0 may correspond to ABS subframes and the other one, e.g. CSI_1 may correspond to non-ABS subframes. According to 3GPP specifications, the time domain restriction measurement pattern is a subset of the ABS pattern. Identification of subframes as ABS and non-ABS is performed by identifying the CSI subframe set that has common subframes with time domain restriction measurement pattern as corresponding to ABS subframes, and the other CSI subframe set as corresponding to non-ABS subframes.

In the following, exemplary solutions for an AGC setting in a UE within a heterogeneous deployment as discussed above are described.

Figure 4:
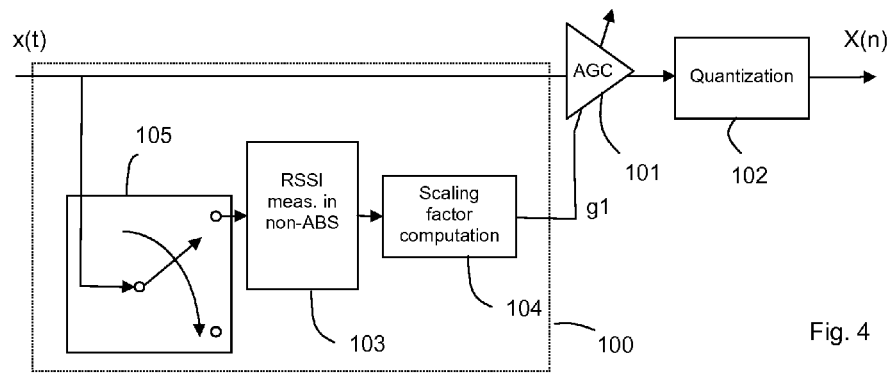
FIG. 4 shows an exemplary embodiment for an AGC control based on non-ABS RSSI measurements.

FIG. 4 shows a simplified structure of an amplifier part of a radio receiver circuit within a mobile terminal -UE-, the circuit comprising a variable gain amplifier 101, a quantization circuit 102 and a gain determination circuit 100. The variable gain amplifier 101 receives an analog signal x(t)

that may be a pre-amplified and down-mixed input signal and received from an antenna of the UE (not shown here). The variable gain amplifier 101 generates an amplified analog signal by amplifying the analog signal x(t) according to a (first) gain value g1 received at its gain input from the gain determination circuit 100. The gain determination circuit comprises a (RSSI) signal power measurement unit 103 and a (RSSI) scaling factor determination circuit 104. According to the example in FIG. 4, the signal power measurement unit 103 performs an RSSI measurement of the non-ABS subframes only. In ABS subframes, the power measurement and the scaling factor computation is not updated and switched off. The (first) gain value g1 is determined by the scaling factor determination unit by an appropriate scaling of the power measurement result. The quantization circuit 102 receives the amplified signal and generates a digital signal X(n) by performing an analog-to-digital conversion. The digital signal X(n) is further provided to a baseband circuit (not shown here) that performs a digital processing in order to obtain a digital content of the signal.

Thus, according to the example of FIG. 4, the AGC adjustment, also being referred to as backoff, both for ABS subframes and non-ABS subframes is based on measurements in non-ABS subframes.

Signal power measurements (e.g. by means of RSSI, RSRERP, RSRP) for non-ABS subframes are always larger than power measurements from ABS subframes; thus the necessary backoff to avoid a signal clipping at the quantization circuit 102 is larger for non-ABS subframes than for ABS subframes.

Hence, it is possible to apply the backoff for non-ABS subframe to avoid clipping although this is a non-ideal operating point for the AGC in ABS subframes i.e. such AGC adjustment avoids the effect of clipping errors at the expense of (slightly) larger quantization errors. In other words, the AGC adjustment is optimized for the signal reception in non-ABS subframes, but not ideal for the ABS subframes.

Signal power measurement may be performed by means of an RSSI measurement as shown in FIG. 4, e.g. by determining above-described linear average of the total received power observed in OFDM symbols containing reference symbols for one specific antenna port, e.g. antenna port 0. FIG. 4 thereto shows a subframe identification and switch circuit 105 adapted for switching-on the RSSI measurement for the duration of non-ABS subframes and for switching-off the measurement during ABS subframes, based on an identification of ABS subframes and non-ABS subframes e.g. as discussed above. The information for switching may be directly taken from the input signal x(t), e.g. by means of a subframe pattern identification.

Figure 5:
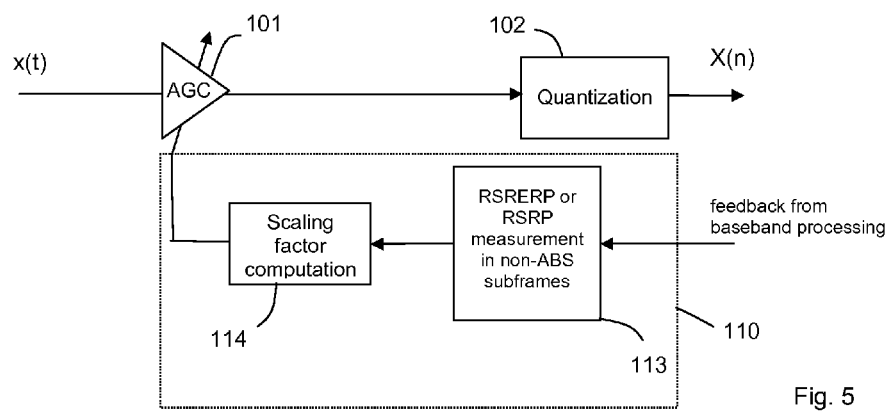
FIG. 5 shows an exemplary embodiment for an AGC control based on non-ABS reference signal power measurements.

FIG. 5 shows a variant to FIG. 4, wherein the power measurement is based on resource element power (e.g. RSRERP or RSRP as discussed above) measurements of the macro cell instead of RSSI measurement. FIG. 5 thereto shows the same variable gain amplifier 101 and quantization circuit 102, but a modified gain determination circuit 110. This circuit comprises a reference signal measurement circuit 113 and a (resource element power) scaling factor determination circuit 114. The resource element power may be determined by means of above-discussed RSRERP measurement or RSRP measurement.

Differently to FIG. 4, the information indicative of the time periods for performing the power measurements is derived from feedback of the baseband processing, as the signal information of the appropriate resource elements to be used for the power measurement cannot be directly derived from the input signal x(t). The feedback is evaluated in the measurement circuit 113 such that only or at least mainly the received power associated to the reference signal is taken into account.

For non-ABS subframes, the necessary backoff is described in FIG. 12. As discussed above, since the necessary backoff for non-ABS subframes is always larger than the one for ABS subframes, it is possible to apply the backoff for non-ABS subframe also in ABS subframes, although this is may be a non-ideal operating point for the AGC in ABS subframes.

For a UE connected to the pico cell, reception in non-ABS subframes may be required for CSI measurements and for obtaining good channel estimates from channel estimation filtering over all subframes. With an AGC specific for ABS subframes, a different gain setting for non-ABS subframes may be applied. Since said UE does not receive data in non-ABS subframes, the gain setting for non-ABS subframes is less critical as compared to the gain setting for ABS subframes.

The gain setting for non-ABS subframes can be obtained e.g. with a constant offset with respect to the AGC gain used for ABS subframes, or with an AGC specific to non-ABS subframes (for example, according to RSSI-based measurements as shown in FIG. 11, for ABS subframes, a 0.71 dB backoff may be needed. For non-ABS subframes, necessary backoff may be 3.59 dB according to FIG. 12. Hence, the constant offset equals 2.88 (3.59 dB–0.71dB). Accordingly, the AGC gain shall be 2.88 dB smaller in non-ABS subframes compared to the AGC gain in non-ABS subframes).

In further developments, a separate AGC adjustment for ABS subframes and non-ABS subframes based on separate measurements is provided.

Figure 6:
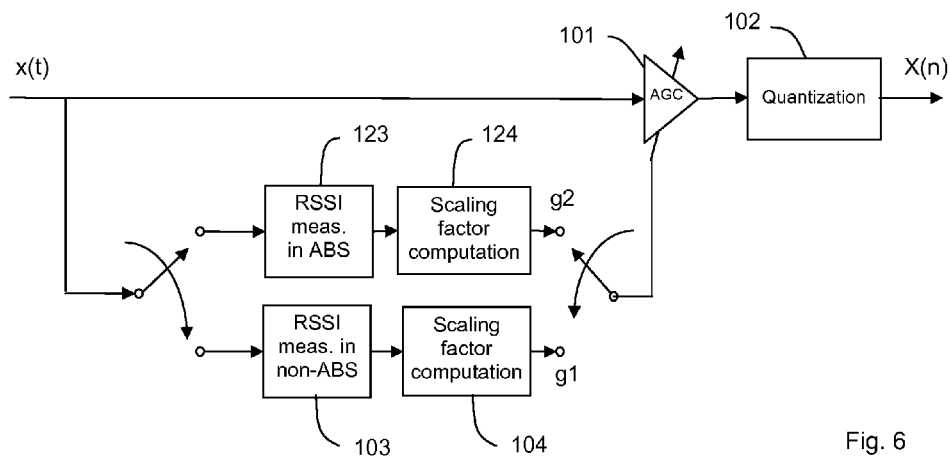
FIG. 6 shows an exemplary embodiment for a separate AGC adjustment for ABS and non-ABS based on RSSI measurements.
Figure 7:
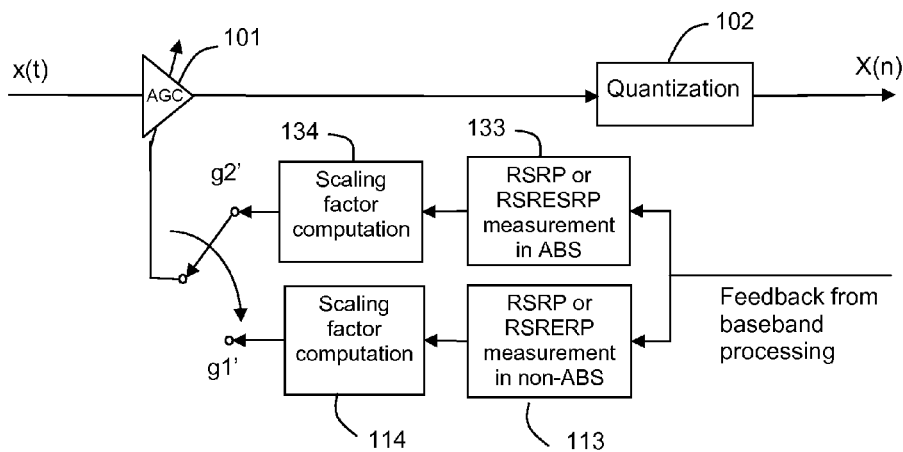
FIG. 7 shows an exemplary embodiment for a separate AGC adjustment for ABS and non-ABS based on reference signal power measurements.

FIG. 6 and FIG. 7 thereto show examples wherein the AGC adjustment for ABS subframes is based on a signal power measurement of received ABS subframes signals, while the AGC adjustment for non-ABS subframe is based on a signal power measurement of received non-ABS subframes signals.

FIG. 6 shows, similarly to above described FIG. 4, the variable gain amplifier 101, the quantization circuit 102, the RSSI measurement unit 103 and the first scaling factor determination circuit 104. Additionally, a second RSSI measurement unit 123 and a second RSSI scaling factor determination circuit are shown wherein the first RSSI measurement unit 103 determines the RSSI in non-ABS only to determine the first gain value g1 and the second RSSI measurement unit 123 determines the RSSI in ABS only to determine a second gain value g2. The input signal x(t) is (alternately) switched to provide either the first RSSI measurement unit 103 or the second RSSI measurement unit 123 with the input signal x(t). This input signal switching is performed in response to a pattern detection that detects a pattern of ABS and non-ABS of the received signal x(t) according to the CSI subsets CSI_0 and CSI_1. Correspondingly to the input signal switching, a gain value switching is performed to switch one of the gain values g1 and g2 to the gain input of the variable gain amplifier 101. The input signal switching and the gain signal switching thereto may be performed synchronously such that the first gain g1 is fed to the variable gain amplifier 101 during non ABS periods and the second gain g2 is fed during ABS periods.

FIG. 7 shows, similarly to above described FIG. 5, the variable gain amplifier 101, the quantization circuit 102, the reference signal power measurement circuit 113 being referred to as first power measurement circuit 113 here, and a resource element power scaling factor determination circuit 114. Additionally, a second (reference signal) power measurement circuit 133 and a second resource element power scaling factor determination circuit 134 are provided. Similarly to FIG. 5, the resource element power may be determined by means of above-discussed RSRERP measurement or RSRP measurement.

Differently to FIG. 5, the information indicative of the time periods for performing the power measurements in ABS or non-ABS is derived from feedback of the baseband processing, as the signal information of the appropriate resource elements to be used for the power measurement cannot be directly derived from the input signal x(t). The feedback is evaluated in both measurement circuits 113 and 133 such that the first measurement circuit 113 determines the resource element power only in non-ABS, and the second measurement circuit 133 determines the resource element power only in non-ABS. Similarly to FIG. 6, a gain signal switching of corresponding gain signal g1' and g2' may be performed synchronously such that g1' is fed to the variable gain amplifier 101 during non-ABS periods and g2' is fed during non-ABS periods.

In a practical network, there may be scheduled some subframes which don't belong to CSI_0 and CSI_1. For these subframes, the same AGC adjustment may be used as for the non-ABS.

In a further development a separate AGC adjustment for ABS and non-ABS, wherein AGC adjustment in ABS is not only based on the serving cell signal power (e.g. RSRP) but also based on (dominant) interfering cell signal power. To improve above-discussed embodiments, both serving cell and interfering cell RSRERP or RSRP is taken into account for AGC adjustment.

Figure 8:
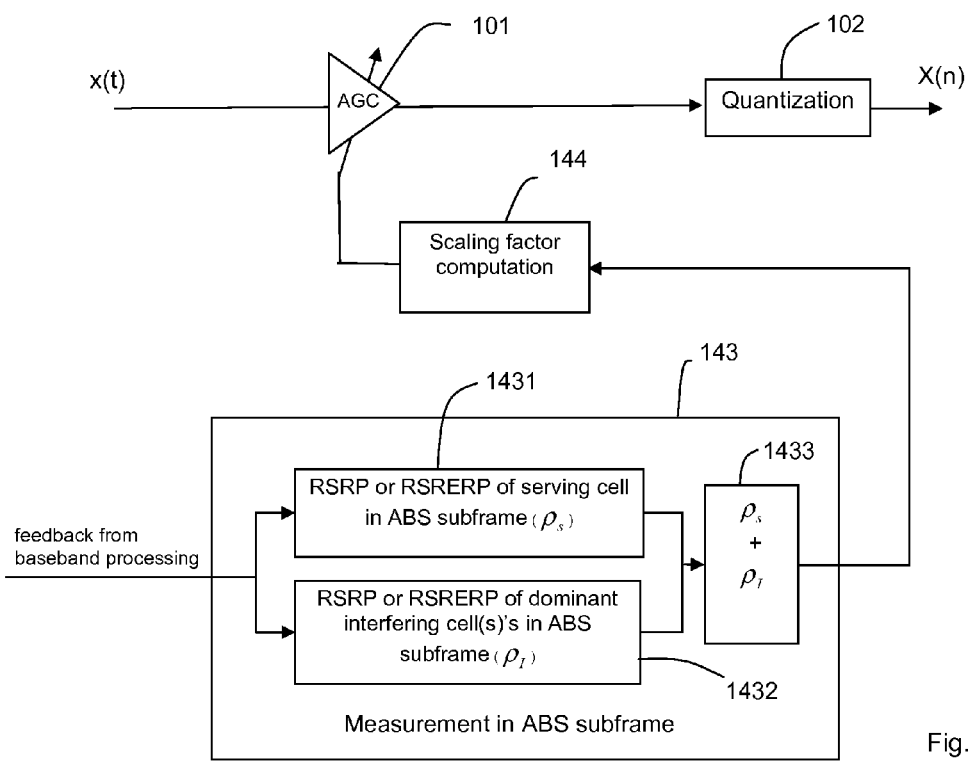
FIG. 8 shows an exemplary embodiment for an AGC adjustment taking into account a power of one or a plurality of dominant interfering cells.

Thereto FIG. 8 shows a principle block diagram comprising a modified reference signal power measurement circuit 143 e.g. to replace the second reference signal power measurement circuit 133 in FIG. 7. The modified reference signal power measurement circuit 143 comprises a serving cell power measurement circuit 1431, an interfering cell power measurement circuit 1432 and an adding circuit 1433. The serving cell power measurement circuit 1431 performs an RSRP or RSRERP measurement of the serving cell (e.g. the pico cell) during ABS and the interfering cell power measurement circuit 1432 performs an RSRP or RSRERP measurement e.g. of a dominant interfering cell during ABS. The adding circuit adds the serving cell and interfering cell RSRERP or RSRP measurement result to generate a combined reference power for AGC adjustment. In an embodiment, a weighted sum is determined by differently weighting each the RSRP (or RSRERP) measurement of the serving cell in ABS and the interfering cell in ABS, and adding the differently weighted results up to the combined reference power for AGC adjustment.

This solution has the advantage that (e.g. for AGC based on RSRP or RSRERP measurements with non-colliding CRS) it does not require a backoff corresponding to the worst case interference power, as an actual power level of the interference is taken into account.

For this solution, some information on the interfering cell (or interfering cells) CRS is required. According to Rel-10, this information may be acquired by the UE. According to Rel-11, this information will be available from eNB signaling, wherein the eNB will signal the cell ID and number of antenna ports of dominant interfering cell for CRS interference handling. Based on the cell ID and the number of antenna ports, the UE determines appropriate resource elements for variance estimation.

In a further embodiment, a separate AGC adjustment for ABS and non-ABS subframe is performed according to above-described embodiments, but taking into account a variation of signal power in ABS periods. The AGC is adjusted e.g. according to the above-discussed solution, except that the AGC adjustment in ABS is also varying per OFDM symbol. In particular, in ABS for OFDM symbols with CRS from the dominant interfering macro cell, the AGC adjustment is based on a sum of RSRP from serving pico cell and RSRP from dominant interfering macro cell, while in other OFDM symbols the AGC adjustment is based on RSRP from serving pico cell only.

Above discussed examples aim to perform AGC adjustment in heterogeneous deployments taking into account an occurrence of ABS and non-ABS in order to avoid or reduce receiver performance degradation. Depending on circumstances and targets to be achieved one out of the solution or a combination of different solutions may be selected to reduce or minimize clipping noise and quantization noise with respect to conventional AGC.

By way of example an RSRERP determination for ABS subframes and non-ABS subframes discussed in more details:

In ABS subframes, no PDSCH signal is transmitted from the strongest interference cell. Hence, in the first CRS carrying symbol of ABS subframes, RSRERP is given by:

$$P_{received,CRS}^{ABS} = P_{dominant\ macro}^{I} + P_{others}^{I} + P_{pico,CRS}^{s}$$

where:

$P_{dominant\ macro}^{I}$ is the total received power coming from dominant macro cell as given by $$P_{doninant\ macro}^{I} = \begin{cases} P_{doninant\ macro,CRS}^{I} & \text{in case of colliding } CRS \\ 0 & \text{otherwise} \end{cases}$$

$P_{others}^{I}$ is the interference power coming from other interfering cells, including non-dominant macros cells and non-serving pico cells, as well as thermal noise, and $P_{pico,CRS}^{s}$ is the received power corresponding to the serving pico cell's CRS.

In other symbols which do not carry CRS, the received power is much smaller.

In non-ABS subframes, RSRERP in the first CRS carrying symbol is given by:

$$P_{received,CRS}^{non-ABS} = P_{dominant\ macro}^{I} + P_{others}^{I} + P_{pico,CRS}^{s}$$

where:

$P_{dominant\ macro}^{I}$ is the total received power coming from dominant macro cell as given by $$P_{doninant\ macro}^{I} = \begin{cases} P_{doninant\ macro,CRS}^{I} & \text{in case of colliding } CRS \\ P_{doninant\ macro,data}^{I} & \text{otherwise} \end{cases}$$

It is noted that in ABS subframes and non-ABS subframes, the power level of $P_{others}^{I}$ can be different.

FIG. 9 thereto exemplarily shows a first table with normalized power contributions of above-described powers $P_{pico,CRS}^{s}$, $P_{dominant\ macro,CRS}^{I}$, $P_{dominant\ macro,data}^{I}$ and $P_{others}^{I}$ (in dB) for ABS and non-ABS subframes according exemplary to system level simulation results for an assumed bias of 9 dB (in the range of above-cited feICIC of Rel-11).

In the following, a necessary reduction of the gain setting with respect to measurement power to avoid (additional)

clipping errors will be discussed. Generally, to avoid clipping errors, the gain setting of an AGC may be reduced with respect to a (theoretical) optimum setpoint by:

- a possible change of the measured power from one subframe where the measurement is obtained to the next subframe where the gain setting corresponding to the measurement is applied and/or
- a maximum possible difference between the total received power and the measured power.

It may be further advantageous to differentiate between situations with colliding CRS and non-colliding CRS transmitted from different base stations.

By way of example, according to 3GPP TS 36.211 (e.g. section 6.10.1 of current version 11.0.0.), the position of the resource elements carrying CRS in the frequency domain is shifted according to the physical cell ID ($N_{ID}^{Cell}$). The number of shifted resource elements is given by $N_{ID}^{Cell}$ mod 6. When each the CRS of two cells are with the same shift, they may be referred to as colliding CRS; otherwise, if the shift between both CRS is different, they may be referred to as non-colliding CRS.

The UE may differentiate between the case of colliding CRS and non-colliding CRS based on the physical cell ID. The physical cell ID may be acquired based on synchronization channel communication or based on high layer signaling.

FIG. 10 shows a second table indicative of a necessary reduction of an AGC gain setting to avoid additional clipping errors irrespective of a presence of ABS and non-ABS. For obtaining the reduction values, 2 cell specific antenna ports are assumed. The necessary reduction in the gain setting with respect to measurement power as shown in this is given as a nominal value which may need adjustment to account for various scaling operations in a given design.

FIG. 11 shows a third table indicative of a necessary reduction of an AGC gain setting to avoid additional clipping errors in ABS subframes only. A comparison between the tables of FIG. 10 and FIG. 11 shows a gain of the dynamic range for ABS subframes of almost 4 dB (it is to be noted that a gain of 6 dB corresponds to 1 bit in the word length of a signal).

FIG. 12 shows a fourth table indicative of a necessary reduction of an AGC gain setting to avoid additional clipping errors in non-ABS subframes only. A comparison between the tables of FIG. 10 and FIG. 12 show that there is a small gain in dynamic range for non-ABS subframes of up to 1.7 dB, depending on the type of measurement chosen for gain control.

FIG. 13 shows a fifth table indicative of a necessary reduction of an AGC gain setting to avoid additional clipping errors in ABS subframes only taking into account one or a plurality of dominant interfering cells RSRP/RSRERP according to the example of FIG. 8. A comparison between the tables of FIG. 11 and FIG. 13 shows a gain of the dynamic range for ABS subframes of almost 10 dB if RSRP measurement is chosen for gain control. Compared with RSRERP based measurements shown in FIG. 11, the dynamic range for ABS subframes is stable for both colliding CRS and non-colliding CRS.

FIG. 14 shows a sixth table indicative of a necessary reduction of an AGC gain setting to avoid additional clipping errors in non-ABS subframes taking into account a dominant interfering cell RSRP/RSRERP according to the example of FIG. 8. A comparison between the tables of FIG. 12 and FIG. 14 shows a gain of the dynamic range for non-ABS subframes of almost 10 dB if RSRP measurement is chosen for gain control. Compared with RSRERP based measurements shown in FIG. 11, the dynamic range for non-ABS subframes is stable for both colliding CRS and non-colliding CRS.

Comparing the second, third and fourth table of FIGS. 10, 11, 12 respectively shows that there may be a significant difference in the required AGC gain reduction or backoff based on RSRERP measurements in the cases of colliding and non-colliding cell specific reference signals. In a case that an AGC algorithm is not aware whether it is based on colliding or non-colliding CRS, the worst case or largest backoff among the two cases has to be chosen to avoid the clipping error effects as described above.

Thus, it may be advantageous to use knowledge in the UE about whether CRS is colliding or non-colliding for determining a adapted backoff; such knowledge may be present in the UE to be able to handle channel estimation differently for colliding CRS and non-colliding CRS.

The invention claimed is:

1. A method for performing an automatic gain control (AGC) with respect to a received signal, the received signal comprising a plurality of consecutive subframes, the method comprising:
    identifying subframes that are associated with a first subset of the consecutive subframes;
    performing a first signal power measurement with respect to the received signal during the first subset of the consecutive subframes;
    performing a second signal power measurement with respect to the received signal during a second subset of the consecutive subframes, the second set comprising the subframes that are not comprised by the first subset;
    performing the AGC according to the first signal power measurement during the subframes of the first subset;
    performing the AGC according to the second signal power measurement during the subframes of the second subset.

2. The method of claim 1, wherein performing the AGC comprises:
    determining a first gain value for performing the AGC during the first subset of the consecutive subframes; and
    determining a second gain value derived from the first gain value for performing the AGC outside the first subset of subframes.

3. The method of claim 1, wherein performing the second signal power measurement comprises:
    determining a serving cell power value by performing a power measurement of resource elements associated to a serving cell;
    determining an interfering cell power value by performing a power measurement of resource elements associated to one or a plurality of an interfering cells;
    performing the AGC according to a combination of serving cell power value and the interfering cell power value during the subframes of the second subset.

4. The method of claim 3, wherein the combination of serving cell power value and the interfering cell power value is based on one of a sum of both power values and a weighted sum of both power values.

5. The method of claim 4:
    wherein performing the first signal power measurement comprises determining a power value based on power contributions of resource elements that carry a cell-specific reference signal (CRS) within the subframes;
    further comprising detecting if a first CRS from the serving cell and a second CRS from a dominant interfering cell of the one or the plurality of interfering cells are colliding or not colliding;
further comprising selectively performing the AGC based on whether the first CRS and the second CRS are colliding or not colliding.

6. The method of claim 5, wherein the detecting is performed by determining a physical cell ID.

7. The method of claim 5, further comprising:
detecting a frequency shift between the first and the second CRS;
determining that the first and the second CRS are colliding in response to there being no frequency shift between both CRS; otherwise, determining that the first and the second CRS are not colliding.

8. The method of claim 1, wherein performing the first signal power measurement comprises performing a measurement of a strength of the received signal within the subframes of the first subset.

9. The method of claim 1, wherein performing the first signal power measurement comprises determining a power value based on power contributions of resource elements that carry a cell-specific reference signal (CRS) within a measurement frequency bandwidth within the subframes of the first subset.

10. The method of claim 9, wherein the power value is determined by calculating a linear average of the power contributions.

11. The method of claim 2:
wherein the method is performed in a heterogeneous network comprising a macro cell served by a macro base station and a pico cell served by a pico base station;
wherein the second subset of subframes are almost blank subframes (ABS), during which the macro base station performs a signal transmission at a reduced power.

12. The method of claim 1, wherein identifying the subframes is performed by identifying a repetitive pattern of subframes.

13. A user equipment, comprising:
a receiver configured to receive a signal comprising a plurality of consecutive subframes;
a processing circuit configured to identify subframes that are associated with a first subset of the consecutive subframes;
a measurement circuit configured to:
perform a first signal power measurement with respect to the received signal during the first subset of the consecutive subframes;
perform a second signal power measurement with respect to the received signal during a second subset of the consecutive subframes, the second subset comprising the subframes that are not comprised by the first subset;
a variable amplifier configured to:
perform Automatic Gain Control (AGC) of the received signal according to the first signal power measurement during the subframes of the first subset; and
perform the AGC according to the second signal power measurement during the subframes of the second subset.

14. The user equipment of claim 13, wherein the variable amplifier is configured to:
determine a first gain value for performing the AGC during the first subset of the consecutive subframes;
determine a second gain value, derived from the first gain value, for performing the AGC outside the first subset of subframes.

15. The user equipment of claim 13, wherein the measurement circuit is configured to:
determine a serving cell power value by performing a power measurement of resource elements associated to a serving cell;
determine an interfering cell power value by performing a power measurement of resource elements associated to one or a plurality of an interfering cells.

16. The user equipment of claim 15, wherein the variable amplifier is configured to perform the AGC according to a combination of a serving cell power value and the interfering cell power value during the subframes of the second subset.

17. The user equipment of claim 16, wherein the variable amplifier is configured to combine the serving cell power value and the interfering cell power value based on one of: a sum of both power values and a weighted sum of both power values.

18. The user equipment of claim 17:
wherein the measurement circuit is configured to detect if a first cell-specific reference signal (CRS) from the serving cell and a second CRS from a dominant interfering cell of the one or the plurality of interfering cells are colliding or not colliding;
wherein the user equipment is configured to perform the AGC based on whether the first CRS and the second CRS are colliding or not colliding.

19. The user equipment of claim 18, wherein the measurement circuit is configured to determine a physical cell ID.

20. The user equipment of claim 18, wherein the measurement circuit is configured to:
detect a frequency shift between the first and the second CRS,
determine that the first and the second CRS are colliding in response to there being no frequency shift between both CRS; otherwise determine that the first and the second CRS are not colliding.

21. The user equipment of claim 13, wherein the measurement circuit is configured to perform a measurement of a strength of the received signal within the subframes of the first subset.

22. The user equipment of claim 13, wherein the measurement circuit is configured to perform the first signal power measurement by determining a power value based on power contributions of resource elements that carry a cell-specific reference signal (CRS) within a measurement frequency bandwidth within the subframes of the first subset.

23. The user equipment of claim 13, wherein the processing circuit is configured to identify the sets of subframes by identifying a repetitive pattern of subframes.

24. A user equipment, comprising:
processing circuitry;
memory operatively connected to the processing circuitry, wherein the memory comprises instructions executable by the processing circuitry to cause the user equipment to:
identify subframes that are associated to a first subset of the consecutive subframes;
perform a first signal power measurement with respect to the received signal during the first subset of the consecutive subframes;
perform a second signal power measurement with respect to the received signal during a second subset of the consecutive subframes, the second subset comprising the subframes that are not comprised by the first subset;

perform Automatic Gain Control (AGC) according to the first signal power measurement during the subframes of the first subset;

perform the AGC according to the second signal power measurement during the subframes of the second subset.

25. A computer program product stored in a non-transitory computer readable medium for controlling performance of automatic gain control (AGC) with respect to a received signal, the received signal comprising a plurality of consecutive subframes, the computer program product comprising software instructions which, when run on a processing circuit of a user equipment, causes the user equipment to:

identify subframes that are associated with a first subset of the consecutive subframes;

perform a first signal power measurement with respect to the received signal during the first subset of the consecutive subframes;

perform a second signal power measurement with respect to the received signal during a second subset, the second subset comprising the subframes that are not comprised by the first subset;

perform the AGC based on the first signal power measurement during the subframes of the first subset; and perform the AGC according to the second signal power measurement during the subframes of the second subset.

26. The method of claim 1, wherein said identifying the subframes is based on a difference between information carried in the first and second subsets.

27. The method of claim 26, wherein the difference includes a difference between indications of channel state information (CSI) carried in the first and second subsets.

28. The method of claim 26 wherein the difference includes a difference between indications of signal quality measurements carried in the first and second subsets.

29. The method of claim 26, wherein the difference includes a difference between indications of neighbor cells in the first and second subsets.

30. The method of claim 26, wherein the information carried in the first and second subsets allows for determining whether each consecutive subframe is an almost-blank subframe (ABS) or a non-ABS.

* * * * *